(12) United States Patent
Darwish et al.

(10) Patent No.: US 6,696,342 B1
(45) Date of Patent: Feb. 24, 2004

(54) SMALL EMITTER AND BASE-COLLECTOR BI-POLAR TRANSISTOR

(75) Inventors: Mohamed N. Darwish, Campbell, CA (US); Alexei Sadovinkov, Sunnyvale, CA (US); Reda Razouk, Sunnyvale, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/882,936

(22) Filed: Jun. 15, 2001

(51) Int. Cl.[7] .................................. H01L 21/8222
(52) U.S. Cl. ........................ 438/309; 438/343
(58) Field of Search ............... 257/565, 574, 257/575, 583, 587, 591; 438/309, 205, 313, 340, 343, 203, 213, 322, 323

(56) References Cited

U.S. PATENT DOCUMENTS

| | | | | |
|---|---|---|---|---|
| 5,406,113 A | * | 4/1995 | Horie | 257/563 |
| 5,420,454 A | * | 5/1995 | Vook et al. | 257/518 |
| 6,043,552 A | * | 3/2000 | Miwa | 257/587 |
| 6,271,577 B1 | * | 8/2001 | Havemann | 257/592 |
| 6,368,946 B1 | * | 4/2002 | Dekker et al. | 438/488 |
| 6,380,017 B1 | * | 4/2002 | Darwish et al. | 438/202 |
| 6,521,974 B1 | * | 2/2003 | Oda et al. | |

* cited by examiner

Primary Examiner—Tom Thomas
Assistant Examiner—Douglas W. Owens
(74) Attorney, Agent, or Firm—Vollrath & Associates

(57) ABSTRACT

In a high speed BJT device, the method for producing the device includes forming a self-aligned BJT through the use of a single mask by making use of a single layer of polysilicon. The method includes forming a window in the polysilicon to define a base poly region and an emitter poly region. An underlying oxide/nitride stack is etched in a two etch process to define base and emitter regions for growing a small base and a small emitter. This displays small base-collector and base-emitter junction regions to reduce the capacitance.

1 Claim, 3 Drawing Sheets

SMALL EMITTER AND BASE-COLLECTOR BI-POLAR TRANSISTOR

FIELD OF THE INVENTION

The invention relates to high speed bi-polar junction transistors.

BACKGROUND OF THE INVENTION

As RF technology continues to develop, in particular in the fields of optical networking and wireless transmissions, higher frequencies are constantly being sought. As a result, transistor sizes have to be reduced in order to decrease junction compacitance and reduce the current and heat dissipation. Attempts have been made at reducing the base-emitter junction area to reduce the capacitor effect of the junction. However, these devices still display large base-collector junction areas resulting in a high capacitance at the base collector junction, which will therefore set the upper limit on the speed that the device can handle.

In the prior art device, illustrated in FIG. 1, dielectric spacers in the form of oxide and nitride posts, are used inside a base polysilicon window thereby achieving a self-aligned bi-polar junction transistor (BJT) with an emitter region smaller than photolithography limits. The device of FIG. 1 is formed with a base polysilicon layer 10. Using a mask etching step, a window is etched through to the base polysilicon 10. Thereafter, the posts are formed on either side, each comprising an-oxide post 14 sandwiched between two nitride posts 16. A second polysilicon layer 18 is then deposited to define the emitter 20. As can be seen from FIG. 1, the junction between the emitter poly 20 and the base poly 10 is reduced due to the reduced emitter size caused by the dielectric spaces 12, 14, 16. However, the base area 22 remains relatively large since it includes not only the two base contacts, but also the two sets of spaces, and the width of the emitter, each being about 0.1 μm. From each of these dimensions, the total base width, which defines the base-collector junction area, is approximately 0.5 μm thereby giving a basecollector area that is approximately five times greater than the base-emitter junction area. Ideally, the two junction areas should be approximately of the same order of magnitude.

The second prior art device is illustrated in FIG. 2 which uses a polysilicon spacer 30 as a diffusion source to form a very small emitter region 32. However, in order to form the base contact 34, boron is implanted into the base 36. In order to avoid the boron doping the polysilicon, a separate mask is required to shield the polysilicon. This need for a second mask thus forfeits the benefits of a self-aligned mask. Furthermore in order to ensure that the boron does not inadvertently impinge upon the polysilicon, the mask has to extend sufficiently far across the base to take account of alignment difficulties. This results in a large emitter to extrinsic base separation, and therefore a large base-collector junction area. This embodiment has the additional problem of not stopping sacrificial polysilicon etching at the base epi surface which can lead to increased leakage due to damage of the silicon crystal lattice.

Thus a need exists for a BJT structure with sub-lithography dimensions that does not suffer from the drawbacks of the prior art.

SUMMARY OF THE INVENTION

According to the invention, there is provided a method of reducing the base-emitter junction area and the base-collector junction area in a bi-polar junction transistor (BJT), comprising using a single poly layer as a contact to both the base and the emitter regions of the BJT.

Preferably the method includes etching a nitride/oxide stack using the poly as a mask, to define a window for a base. The etching preferably involves an oxide etch process and typically includes overetching the oxide and then growing the base. The method typically also includes etching away the nitride between the grown base and the poly layer using a wet etch process, to define a gap region for the emitter. Typically, the emitter is formed by an epi process to fill the gap region, followed by an a doping of the epi in the gap region. The doping may be achieved by diffusing a dopant into the epi from the poly using an annealing step.

Further, according to the invention there is provided a method of forming a small base and emitter in a BJT, comprising etching a region for a base and an emitter into an oxide, using a poly layer as a mask wherein an oxide etch process is used and the poly layer is protected by nitride layers during the oxide etch process, and wherein at least a portion of one of the nitride layers is removed using a nitride etch process to define a region for the emitter.

Still further, according to the invention, there is provided a method of forming a base and an emitter in a BJT, comprising using a first etch process to form a region for the base, and using a second etch process to define a region for the emitter. Typically the first etch process is used to over etch an oxide layer under a poly layer. The second etch process typically includes etching away at least part of a nitride layer between the poly layer and the oxide layer.

DETAILED DESCRIPTION OF THE INVENTION

Figure 1:
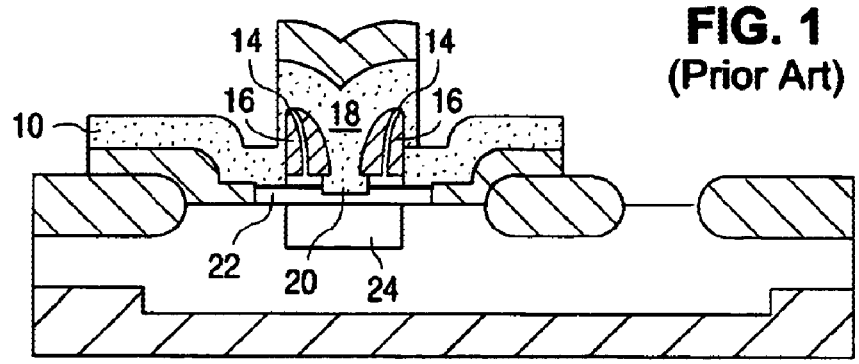
FIG. 1 is a sectional representation of a prior art BJT device.
Figure 3:
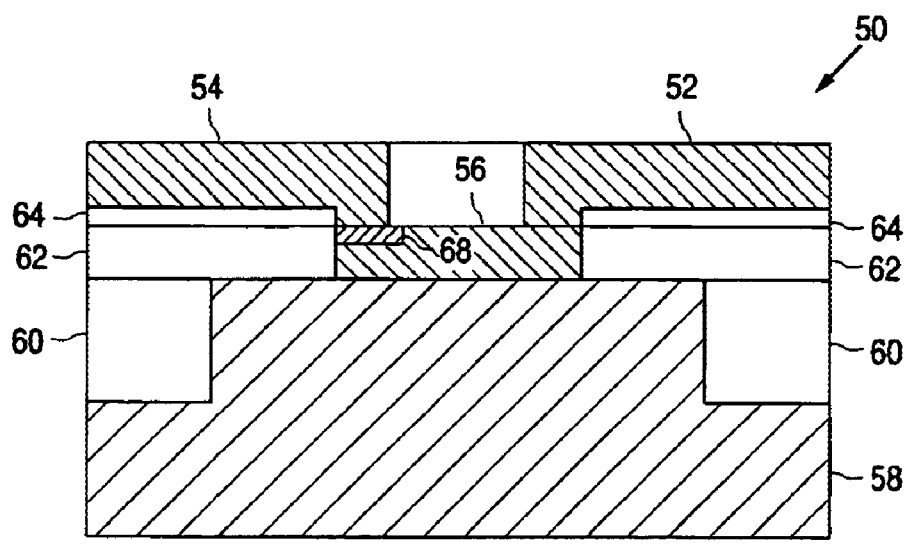
FIG. 3 is a sectional representation of BJT device of the invention.
Figure 4:
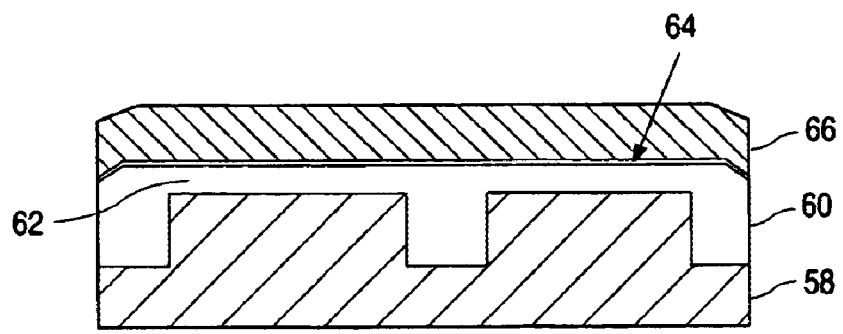
FIGS. 4–9 are sectional representations showing the steps of producing a BJT of the invention.

FIG. 3 shows a sectional representation of a BJT structure 50 of the invention. The structure's base poly 52 and emitter poly 54 are self-aligned, i.e., a single mask is used to form both the base poly 52 and the emitter poly 54. The structure 50, the manufacture of which is described in greater detail below, provides a small emitter-base junction area and base-collector area. By way of example, in an embodiment using 0.2 micron design rules, the disclosed structure 50 achieves a base-collector junction area of approximately 0.162 $\mu m^2$ versus 0.32 $\mu m^2$ for the prior art device shown in FIG. 1, thus providing an improvement of approximately a factor of two.

In the embodiment shown in FIG. 3, the base 56 is grown with Ge or GeC to produce a SiGe or SiGeC base epi region, however it will be appreciated that the structure could also use other impurities and could equally well be implemented in the form of an implanted base architecture.

The process of one embodiment of the invention will be described with reference for FIGS. 4 to 9. This Bi-CMOS process involves forming a buried layer and growing a collector epitaxial layer over the buried layer to define the collector 58. Shallow trench isolations 60 are formed from oxide to isolate the collector 58 from the collector contact (not shown). Mat oxides 62 are formed by depositing an oxide layer 62 of about 1,000 Å over the collector 58 and the shallow trench isolation regions 60. Thereafter a nitride layer 64 of approximaty 100 Å and an un-doped poly layer 66 (FIG. 4) of approximately 2,000 Å are deposited. In order to define the base poly 52 and emitter poly 54, a photoresist (not shown) is deposited on the poly layer 66, and a window 70 is cut into the poly layer 66 using an etch process.

Figure 5:
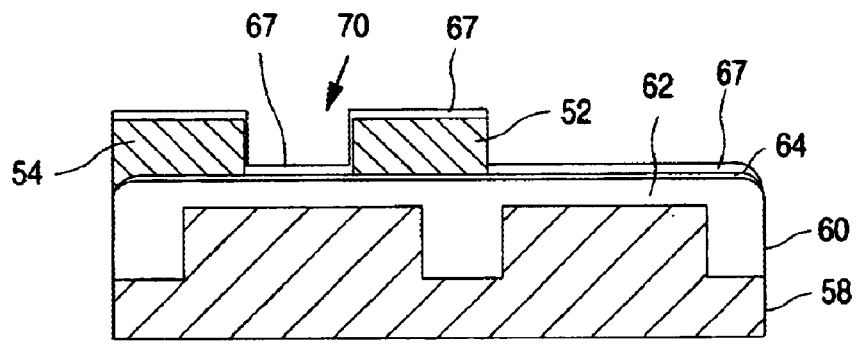
Figure 6:
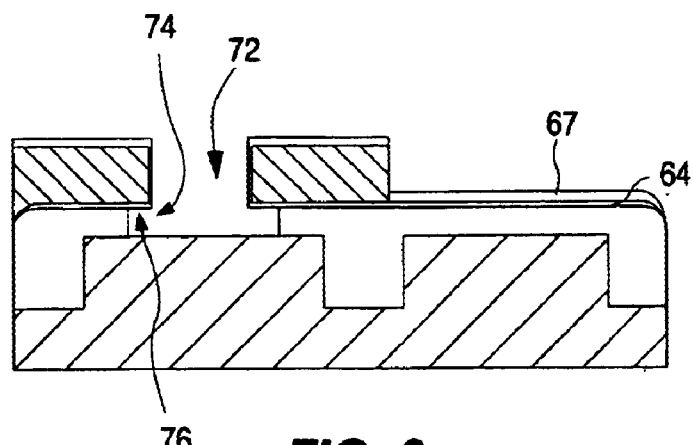

As shown in FIG. 5, the poly is etched down to the nitride layer 64, to define the 0.2 $\mu$m window 70 in the poly/oxide stack. A second nitride layer 67 is then deposited on top of the structure. Thereafter, as shown in FIG. 6, the nitride in the window 70, and the oxide of the nitride/oxide stack is etched using an oxide mat definition mask to define a window 72 in the oxide. By selectively over etching the oxide, an undercut 74 of approximately 1,000 Å is achieved as shown in FIG. 6. As will be discussed in greater detail below, the size of the undercut 74 will define the size of the emitter of the BJT device.

Figure 7:
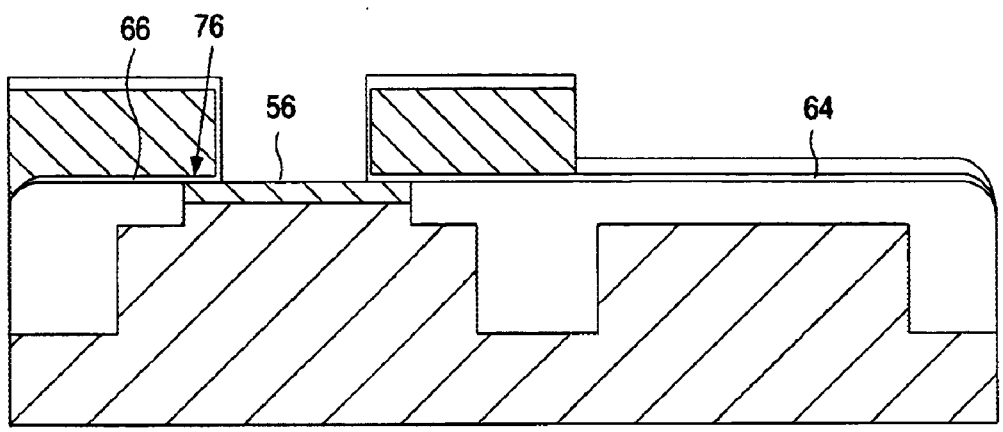
Figure 8:
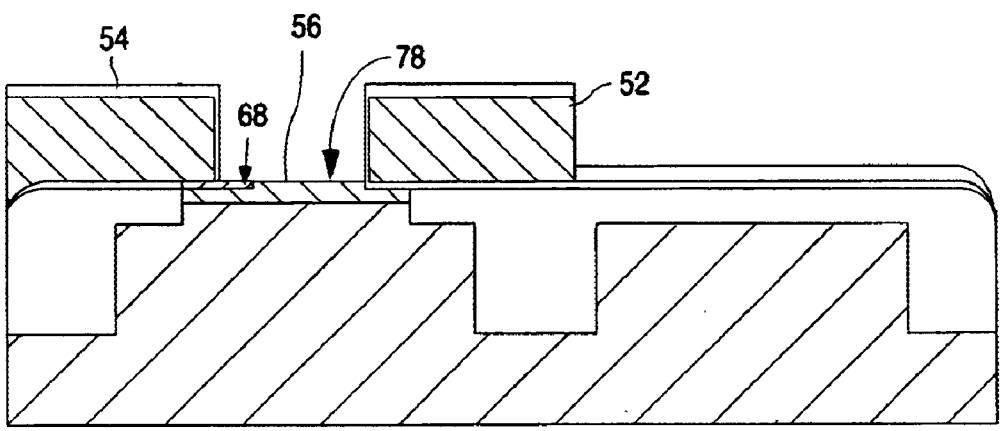
Figure 9:
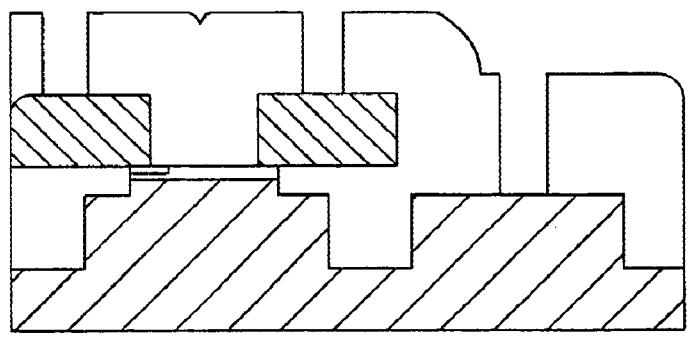

Referring to FIGS. 7 to 9, a base epi region 56 of approximately 1,000 Å is grown in the window 72 to extend under the emitter poly 54. As mentioned above, germanium (Ge) or germanium-carbon (GeC) can be added to the base 56 to enhance the BJT performance. The nitride 76 remaining under the polysilicon (as part of the nitride layer 64) after the oxide etch process, is then etched away using a nitride wet etch process. The gaps that remain (approximately 75 Å) are then filled by continuing to grow the epi. $BF_2$ of dose 2e14 and energy of approximately 10 keV is then implanted in the base epi 56 to form a shallow BaseLink region 78. The emitter 68 and extrinsic base under the base poly 52 are then formed by diffusing phosphorous and arsenic, respectively, into the polysilicon during Rapid Thermal Anneal (RTA). The emitter poly contact region 54 is formed by phosphorous implantation with a dose of approximately 1e16 and energy of approximately 30 keV. The base poly contact region 52 is formed by implanting boron into a defmied region of the poly layer 66 with a dose of approximately 1e16 and energy of approximately 15 keV. Phosphorous from the emitter poly 54 is then diffused into the epi 68 to define the emitter.

A standard silicidation process is then used to form silicide contacts to the polysilicon emitter 54 and polysilicon base 52.

Figure 2:
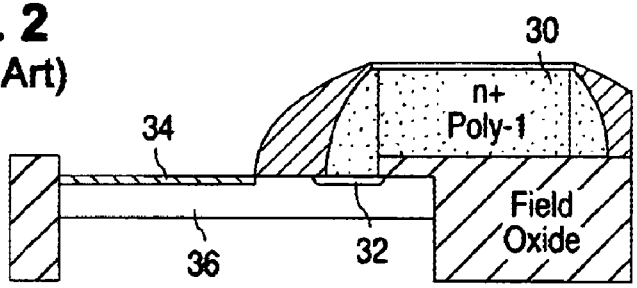
FIG. 2 is a sectional representation of another prior art BJT device.

By using a self-aligned single-poly structure, the misalignment problems and consequent large base area of the prior art embodiment illustrated in FIG. 2, is avoided. Furthermore, the base 56 and emitter 68 are contacted by means of base and emitter polysilicon regions 52, 54, respectively, which are formed over field oxide regions 60, 62, thus lowering the capacitance due to the thick oxide between poly and collector region 58.

What is claimed is:

1. A method of forming a base and an emitter in a BJT, comprising etching a window into a polysilicon layer formed on a nitride layer that is formed on an oxide layer, etching the nitride and oxide in the window to define a base region, and undercutting the oxide under the polysilicon layer to define an undercut region, etching the nitride in the undercut region to define an emitter region, and forming an emitter in the emitter region, and a base in the base region.

* * * * *